US006966965B2

(12) United States Patent
Kuu

(10) Patent No.: US 6,966,965 B2
(45) Date of Patent: Nov. 22, 2005

(54) METAL MATERIAL ADHESION METHOD

(75) Inventor: Wien-Haurn Kuu, Kaohsiung Hsien (TW)

(73) Assignee: Delta Electronics, Taoyuan Hsien (TW)

( * ) Notice: Subject to any disclaimer, the term of this patent is extended or adjusted under 35 U.S.C. 154(b) by 221 days.

(21) Appl. No.: 10/601,489

(22) Filed: Jun. 23, 2003

(65) Prior Publication Data
US 2004/0173302 A1   Sep. 9, 2004

(30) Foreign Application Priority Data
Mar. 3, 2003 (TW) .............................. 92104448 A

(51) Int. Cl.⁷ ................................................ B05D 3/00
(52) U.S. Cl. ..................................... 156/310; 427/327
(58) Field of Search .......................... 156/60, 310, 153; 427/327

(56) References Cited

U.S. PATENT DOCUMENTS 4,762,579 A  *  8/1988  Shimizu et al. ............... 156/69
5,879,810 A  *  3/1999  Ellwood et al. ............ 428/416

\* cited by examiner

Primary Examiner—John T. Haran
(74) Attorney, Agent, or Firm—Patterson & Sheridan, LLP

(57) ABSTRACT

A metal material adhesion method is described. The method is used for an optical transceiver module assembly process to adhere a protection cover of a laser diode in a metal shell and enhance the adhesion strength thereof. The method employs the following steps. First, the protection cover and the metal shell are provided. A primer layer is coated inside the metal shell. The laser diode is aligned with the metal shell to provide a maximum signal strength position. An epoxy layer is glued between the metal shell and the protection cover to fix the laser diode in the best position. The method further provides a sealant layer to protect the epoxy layer from moisture and a second premier layer to enhance the adhesion strength between the protection cover and the epoxy layer.

14 Claims, 1 Drawing Sheet

METAL MATERIAL ADHESION METHOD

BACKGROUND OF THE INVENTION

1. Field of the Invention

The present invention relates to a method of adhering metal materials and especially to a method of adhering a metal protection cover and a metal shell for an optical transceiver module.

2. Background of the Invention

The computer industries have been widely applied in all fields and network technologies have been rapidly progressed. Therefore, people can easily access information and provides service by way of a network. Due to optoelectronic communication devices providing an enormous data transmission capacity, research is focused on optoelectronic technology for improving transmission quality. Recently, the optoelectronic industry combining the electronics industry and the optics industry has progressed to a high degree. An important device is an optical transceiver module which includes an optical transmitter, an optical receiver, or an optical transceiver combing both functions.

The transmitter is capable of transforming electronic signals into optical signals and transmitting the same to an optical fiber. Classifications are made in accordance with the light source; the light source of the transmitter of the optical fiber communication is mainly from a light emitting diode (LED) or a laser diode. Since the laser diode has the advantages of high output power, fast transmitting speed, small emission angle (i.e. a higher efficiency for coupling light source into an optical fiber), and a narrower frequency spectrum (smaller dispersion), the laser diode Is suitable for use in mid or long-range transmissions. While LED has the advantages of low cost and simpler utilization (simpler driving and compensation circuits), LED is only suitable for use in short-range transmissions. In particular, the laser diode, also called a semiconductor laser, has the advantages of small size, low power consumption, quick response, good collision resistance, long operation life, and high efficiency, so that the laser diode is very widely used in the application of optoelectronic products.

The main function of an optical receiver is to convert an optical signal to an electronic signal, of which the most critical component is a detector. The major principle of the detector is to generate enough energy by radiating light on a photo diode for exciting pairs of electrons and holes so as to generate a current signal.

Since optoelectronic components have very precise dimensions, equipment used to manufacture the same requires precise technology. The optical transceiver module therefore includes very precise dimensions. For example, the optical transceiver module manufacturing process starts with laser diode selection. Then, the laser diode is protected by TO-can process with a protection cover and gluing of the same to a metal shell, such as a T-housing made of stainless material. If the T-housing and the laser diode alignments are even a little bit biased, the optical transceiver module loses the optical signal strength and the communication quality is severely degraded. Therefore, the dimensions of the optical transceiver module are very important.

Conventionally, the protection cover is adhered to the metal shell with epoxy resin. For improving the adhesion strength thereof, a surface treatment such as sandblasting is usually performed on the metal shell. The epoxy resin easily absorbs water, especially when the optical transceiver module is exposed to high temperatures and high humidity. The absorbed water then degrades the adhesion strength thereof.

Therefore, there is a need to improve the adhesion strength and reliability of the protection cover and metal shell for the optical transceiver module so as to improve the quality thereof.

SUMMARY OF THE INVENTION

It is an object of the present invention to provide an adhesion method for adhering metal materials to each other.

It is another object of the present invention to provide an adhesion method for adhering a metal protection cover to a metal shell of the optical transceiver module so as to improve the adhesion strength and resist variations in temperature and humidity.

To accomplish the above objectives, the present invention provides a metal material adhesion method for an optical transceiver module assembly process. The metal material adhesion method comprises the following steps. First, a laser diode protection cover and a metal shell are provided. The inside of metal shell is coated with a primer layer. An alignment process is utilized to find a relative position of the metal shell and the laser diode protection cover where an optical fiber can receive the maximum detection signal strength. The laser diode protection cover is adhered to the primer layer inside the metal shell with an epoxy layer.

The laser diode protection cover is made of a Ni—Fe alloy for packing a laser diode and the metal shell is made of stainless material. The primer layer is an epoxy paint or a rubber paint.

Before the laser diode protection cover adheres to the primer layer inside the metal shell With an epoxy layer, the metal material adhesion method according to the present invention further utilizes a prefixing material to prefix the laser diode protection cover to the primer layer. The prefixing material is an instant adhesive or an ultraviolet glue. After the laser diode protection cover adheres to the primer layer inside the metal shell with the epoxy layer, the metal material adhesion method according to the present invention further utilizes a sealant layer to seal the primer layer and the epoxy layer between the laser diode protection cover and the metal shell to isolate the primer layer and the epoxy layer from the environment. The sealant layer is a polypropylene sealant layer, a silicon sealant layer, or an inorganic material sealant layer. The metal material adhesion method according to the present invention further utilizes another primer layer between the epoxy layer and the laser diode protection cover to enhance the adhesion force thereof.

Hence, the metal material adhesion method according to the present invention increases the thermal and humidity resistance of the optical transceiver module. The metal material adhesion method according to the present invention further increases the adhesion force of the protection cover and the metal shell so as to increase the reliability and quality of the optical transceiver module.

BRIEF DESCRIPTION OF THE DRAWINGS

The foregoing aspects and many of the attendant advantages of this invention are more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
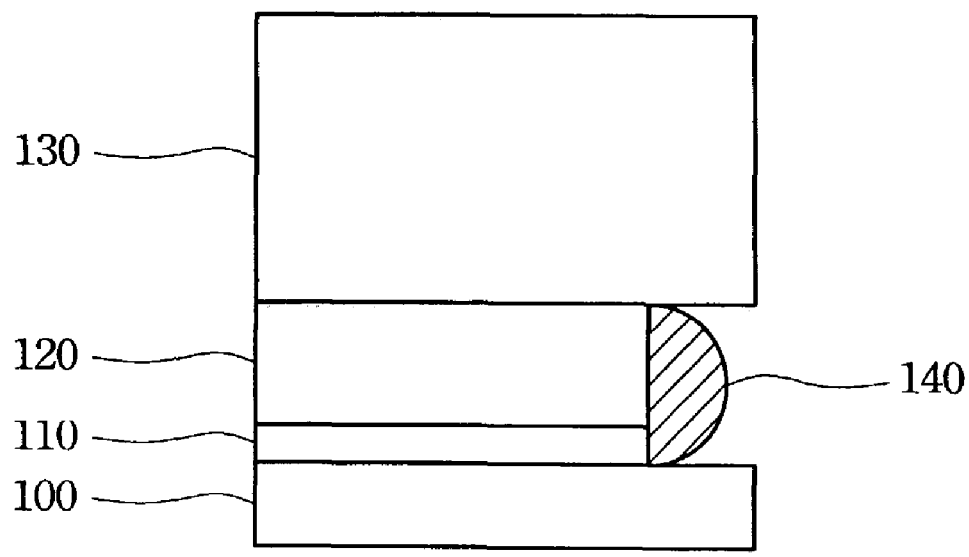
FIG. 1 is a schematic view of a preferred embodiment of metal material adhesion method according to the present invention.

Please refer to FIG. I. FIG. 1 is a schematic view of a preferred embodiment of metal material adhesion method according to the present invention. The metal material adhesion method is utilized to adhere a protection cover 130 to a shell 100 of an optical transceiver module. The protection cover 130 is made of a Ni—Fe alloy material for packing a laser diode and the shell 100 is made of stainless material. Therefore, the protection cover 130 and the shell 100 not only improve the alignment precision of the packed laser diode and an optical fiber core but also reduce the thermal deformation induced by temperature variations and further avoid an electromagnetic interference (EMI) problem.

An adhesion material adhering the shell 100 and the protection cover 130 is not made of a metal material. Because bonding dimensions thereof are very different, the adhesion force from the bonding force thereof is very weak. In particular, adhesion material such as the epoxy resin may absorb water so as to reduce the adhesion force thereof.

The metal material adhesion method according to the present invention uses a primer layer 110 coating on the shell 100, and then adjusts the alignment of the shell 100 and the laser diode packed in the protection cover 130. The alignment process thereof adjusts the relative position of the shell 100 and the protection cover 130 according to a signal strength from the fiber core until the maximum signal strength is captured, prefixes the shell 100 and the protection cover 130 with a prefixing material, and then permanently fixes the shell 100 and the protection cover 130 with epoxy layer 120. The prefixing material can use an ultraviolet glue or an instant adhesive to prefix the shell 100 and the protection cover 130. The prefixing material may be any type of glue with a faster hardening property to fix the shell 100 and the protection cover 130 as quickly as possible. Furthermore, the present invention may omit the prefixing process and directly permanent fix the shell 100 and the protection cover 130 with the epoxy layer 120. As is understood by a person skilled in the art, the foregoing prefixing materials are illustrative of the present invention rather than limiting of the present invention. It is intended that various modifications and similar arrangements be included within the spirit and scope of the present invention.

Because the present invention uses the primer layer 110 previously coated on the shell 100 to reduce the bonding dimension difference between the epoxy layer 120 and the shell 100 so as to increase the bonding force thereof, the metal material adhesion method according to the present invention increases the adhesion force by about 30% compared with the original adhesion method without the primer layer. Therefore, the stability and reliability of the optical transceiver module can be improved.

The metal material adhesion method according to the present invention not only uses the primer layer 110 to improve the adhesion force but also uses a sealant layer 140 to seal the primer layer 110 and the epoxy layer 120 between the shell 100 and the protection cover 130. Therefore, the primer layer 110 and the epoxy layer 120 are isolated from outside humidity. Accordingly, the metal material adhesion method according to the present invention further increases the reliability of the optical transceiver module and effectively reduces the adhesion force reduction problem caused by variations in outside temperature and humidity.

The primer layer of the present invention is an epoxy paint, such as sulfanilamide cured epoxy, methyl cyclohexane 1,2-dicarboxylic anhydride cured epoxy, synthetic cured resin, fatty acid cured epoxy or non-solvent epoxy, or a rubber paint, such as chloroprene rubber, butylbenzene rubber, butyl rubber polysulfur rubber or chlororulfuric polyethylene rubber. The primer layer provides a higher adhesion force between the epoxy layer and the stainless shell and the bonding dimension thereof is better between the stainless and the epoxy. The sealant layer is a sealant layer made of polypropylene, silica gel, inorganic material or epoxy resin.

Figure 2:
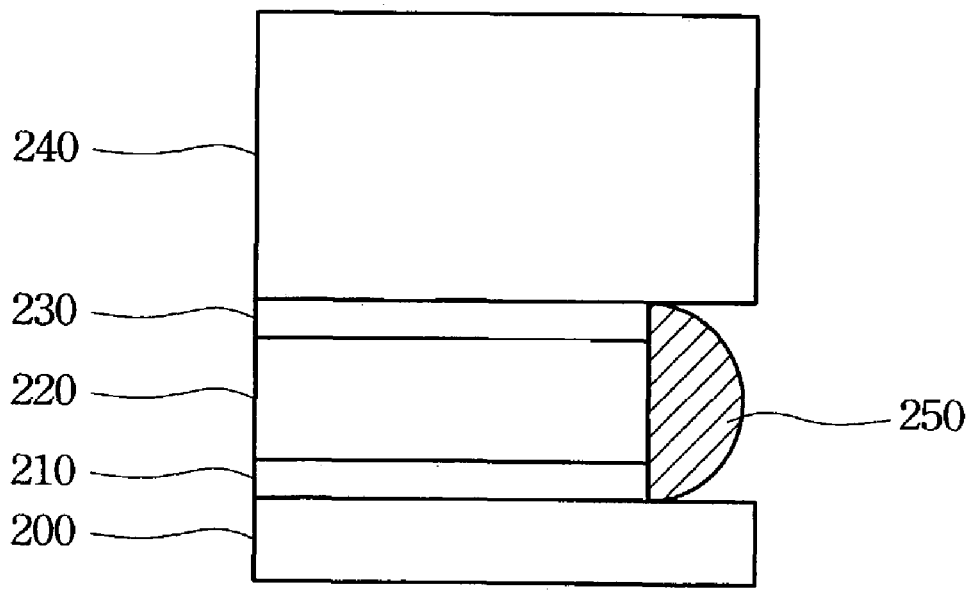
FIG. 2 is a schematic view of another preferred embodiment of metal material adhesion method according to the present invention.

Please refer to FIG. 2. FIG. 2 is a schematic view of another preferred embodiment of metal material adhesion method according to the present invention. This preferred embodiment of metal material adhesion method according to the present invention coats a first primer layer 210 on a shell 200 and a second primer layer 230 on a protection cover 240, and then adheres them with a epoxy layer 220. Finally, a sealant layer 250 seals the first primer layer 210, the second primer layer 230, and the epoxy layer 220 between the shell 200 and the protection cover 240.

The first primer layer 210 and the second primer layer 230 can be the same material or different materials. The material is the same as that used for the embodiment in FIG. 1, such as an epoxy paint or a rubber paint. The sealant layer material is also the same as that used for the embodiment in FIG. 1, such as polypropylene, silica gel, inorganic material or epoxy resin.

The present invention uses the primer layer to enhance the adhesion force of the shell and the protection cover. Therefore, the assembly quality of the optical transceiver module increases. The present invention further uses the sealant layer to reduce the effect of humidity on the epoxy and therefore furthermore increases the assembly reliability and quality of the optical transceiver module. As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

While the foregoing is directed to embodiments of the present invention, other and further embodiments of the invention may be devised without departing from the basic scope thereof, and the scope thereof is determined by the claims that follow.

What is claimed is:

1. A metal material adhesion method for an optical transceiver module assembly process, the metal material adhesion method comprising:
   providing a laser diode protection cover;
   providing a metal shell;
   coating a primer layer in the metal shell;
   utilizing an alignment process according to a detection signal strength to determine a relative position of the metal shell and the laser diode protection cover; and
   adhering the laser diode protection cover to the primer layer inside the metal shell with an epoxy layer, wherein a step of utilizing a prefixing material to prefix the laser diode protection cover to the primer layer is performed before the adhering step.

2. The metal material adhesion method of claim 1, wherein the alignment process utilizes an optical fiber to capture the detection signal strength and adjusts the relative position to find a maximum detection signal strength position.

3. The metal material adhesion method of claim 1, wherein the laser diode protection cover is made of a Ni—Fe alloy.

4. The metal material adhesion method of claim 1, wherein the metal shell is made of stainless material.

5. The metal material adhesion method of claim 1, wherein the primer layer is an epoxy paint or a rubber paint.

6. The metal material adhesion method of claim 1, wherein the prefixing material is an instant adhesive or an ultraviolet glue.

7. The metal material adhesion method of claim 1, wherein after the step of adhering the laser diode protection cover to the primer layer further comprises a step of utilizing a sealant layer to seal the primer layer and the epoxy layer between the laser diode protection cover and the metal shell.

8. The metal material adhesion method of claim 7, wherein the sealant layer is a polypropylene sealant layer, a silicon sealant layer, or an inorganic material sealant layer.

9. A metal material adhesion method for an optical transceiver module assembly process, the metal material adhesion method comprising:
providing a laser diode protection cover;
providing a metal shell;
coating a first primer layer in the metal shell;
coating a second primer layer on the laser diode protection cover;
utilizing an alignment process according to a detection signal strength to determine a relative position of the metal shell and the laser diode protection cover; and
adhering the second primer layer on the laser diode protection cover to the first primer layer inside the metal shell with an epoxy layer, wherein a step of utilizing a prefixing material to prefix the second primer layer to the first primer layer is performed before the adhering step.

10. The metal material adhesion method of claim 9, wherein the alignment process utilizes an optical fiber to capture the detection signal strength and adjusts the relative position to find a maximum detection signal strength position.

11. The metal material adhesion method of claim 9, wherein the first primer layer and the second primer layer are an epoxy paint or a rubber paint.

12. The metal material adhesion method of claim 9, wherein the prefixing material is an instant adhesive or an ultraviolet glue.

13. The metal material adhesion method of claim 9, wherein after adhering the second primer layer on the laser diode protection cover to the first primer layer inside the metal shell with an epoxy layer further comprises a step of utilizing a sealant layer to seal the first primer layer, the second primer layer and the epoxy layer between the laser diode protection cover and the metal shell.

14. The metal material adhesion method of claim 13, wherein the sealant layer is a polypropylene sealant layer, a silicon sealant layer, or an inorganic material sealant layer.

* * * * *

UNITED STATES PATENT AND TRADEMARK OFFICE
CERTIFICATE OF CORRECTION

| | |
|---|---|
| PATENT NO. | : 6,966,965 B2 |
| APPLICATION NO. | : 10/601489 |
| DATED | : November 22, 2005 |
| INVENTOR(S) | : Wien-Haurn Kuu |

It is certified that error appears in the above-identified patent and that said Letters Patent is hereby corrected as shown below:

On the Title page:

In Item (73), Assignee, please delete "Delta Electronics" and insert --Delta Electronics, Inc.--.

Signed and Sealed this

Second Day of January, 2007

JON W. DUDAS
*Director of the United States Patent and Trademark Office*